United States Patent
Yang et al.

(10) Patent No.: US 9,904,398 B2
(45) Date of Patent: Feb. 27, 2018

(54) PRESSURE DETECTION UNIT, PRESSURE DETECTION METHOD AND DISPLAY PANEL

(71) Applicants: BOE Technology Group Co., Ltd., Beijing (CN); Beijing BOE Optoelectronics Technology Co., Ltd., Beijing (CN)

(72) Inventors: Shengji Yang, Beijing (CN); Xue Dong, Beijing (CN); Hailin Xue, Beijing (CN); Xiaochuan Chen, Bejing (CN); Haisheng Wang, Beijing (CN); Xiaoliang Ding, Beijing (CN); Chunlei Wang, Beijing (CN); Wei Li, Beijing (CN); Zebin Sun, Beijing (CN); Lingyu Sun, Beijing (CN); Yingming Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 28 days.

(21) Appl. No.: 15/270,243

(22) Filed: Sep. 20, 2016

(65) Prior Publication Data
US 2017/0255313 A1    Sep. 7, 2017

(30) Foreign Application Priority Data
Mar. 3, 2016 (CN) .......................... 2016 1 0121253

(51) Int. Cl.
*G06F 3/044* (2006.01)
*G06F 3/041* (2006.01)

(52) U.S. Cl.
CPC ............ *G06F 3/0414* (2013.01); *G06F 3/044* (2013.01); *G06F 3/0412* (2013.01)

(58) Field of Classification Search
CPC .......... G06F 3/041–3/047; G06F 2203/04105; G06F 2203/04106; Y10T 307/74–307/983
See application file for complete search history.

(56) References Cited

U.S. PATENT DOCUMENTS 8,780,074 B2 * 7/2014 Castillo ................... G06F 3/044
                                                         345/174
9,195,354 B2 * 11/2015 Bulea ....................... G06F 3/044
(Continued)

*Primary Examiner* — Gene W Lee
(74) *Attorney, Agent, or Firm* — Banner & Witcoff, Ltd.

(57) ABSTRACT

A pressure detection unit, a pressure detection method and a display panel are disclosed. The pressure detection unit includes a touch control pressure scanning electrode, a constant voltage electrode, a detection module and at least one touch control pressure induction electrode. A touch control pressure scanning signal is inputted into the touch control pressure scanning electrode; the constant voltage electrode is arranged opposite to the touch control pressure scanning electrode, and a constant voltage is inputted into the constant voltage electrode; an orthographic projection of the touch control pressure induction electrode in a plane where the touch control pressure scanning electrode locates does not overlap with the touch control pressure scanning electrode; the detection module is configured for determining a pressure applied on the pressure detection unit according to change of capacitance.

15 Claims, 3 Drawing Sheets

(56) References Cited

U.S. PATENT DOCUMENTS

| | | | | |
|---|---|---|---|---|
| 9,501,169 | B2* | 11/2016 | Losh | G06F 3/0416 |
| 2008/0018608 | A1* | 1/2008 | Serban | G06F 3/0416 |
| | | | | 345/173 |
| 2014/0267128 | A1* | 9/2014 | Bulea | G06F 3/044 |
| | | | | 345/174 |
| 2017/0351354 | A1* | 12/2017 | Yoon | G06F 3/044 |

* cited by examiner

PRESSURE DETECTION UNIT, PRESSURE DETECTION METHOD AND DISPLAY PANEL

This application claims priority to and the benefit of Chinese Patent Application No. 201610121253.3 filed on Mar. 3, 2016, which application is incorporated herein in its entirety.

TECHNICAL FIELD

Embodiments of the present disclosure relate to a pressure detection unit, a pressure detection method and a display panel.

BACKGROUND

With the development of the display technology, people are hoping to realize the function of detecting the pressure applied on a display panel (for example, a liquid crystal display panel) in addition to realize a touch control function. With the pressure detection function, users can conduct different operations through applying different levels of pressure on the display panel; therefore, the pressure detection function makes the operation more convenient and improves the user experience.

Currently, in the display field, especially in the mobile phone or tablet computer field, additional mechanism can be added in the backlight portion of a liquid crystal display panel or the middle bezel frame portion of a mobile phone. However, such design requires alteration or modification in the structural design of the liquid crystal display panel or the mobile phone; in addition, the detection accuracy of such design is limited because of large assembly tolerance.

Therefore, how to realize high accuracy pressure detection with small alteration or modification in the display panel hardware is a problem that needs to be addressed urgently in the industry.

SUMMARY

An embodiment of the present disclosure provides a pressure detection unit, which comprises: a touch control pressure scanning electrode, which is configured for inputting a touch control pressure scanning signal; a constant voltage electrode, which is arranged opposite to the touch control pressure scanning electrode, wherein the constant voltage electrode is configured for inputting a constant voltage; at least one touch control pressure induction electrode, wherein an orthographic projection of the at least one touch control pressure induction electrode in a plane where the touch control pressure scanning electrode locates does not overlap with the touch control pressure scanning electrode; a detection module, which is electrically connected to the touch control pressure scanning electrode and the at least one touch control pressure induction electrode, wherein the detection module is configured for determining a pressure applied on the pressure detection unit according to change of directly opposite capacitance generated between the touch control pressure scanning electrode and the constant voltage electrode and change of coupling capacitance generated between the touch control pressure scanning electrode and the at least one touch control pressure induction electrode upon a touch control operation occurring.

Another embodiment of the present disclosure provides a pressure detection method, the pressure detection method is based on the above pressure detection unit, and the pressure detection method comprises: applying a touch control pressure scanning signal on the touch control pressure scanning electrode; determining a pressure applied on the pressure detection unit according to the change of the directly opposite capacitance generated between the touch control pressure scanning electrode and the constant voltage electrode and the change of the coupling capacitance generated between the touch control pressure scanning electrode and the at least one touch control pressure induction electrode.

Further another embodiment of the present disclosure provides a display panel, which comprising the above pressure detection unit.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left"

and the like are only used to indicate relative position relationship, and when the position of the object which is described is changed, the relative position relationship may be changed accordingly.

In the following, a pressure detection unit, a pressure detection method and a display panel provided by the embodiments of the present disclosure are described in detail with reference to the accompany drawings.

First Embodiment

Figure 1:
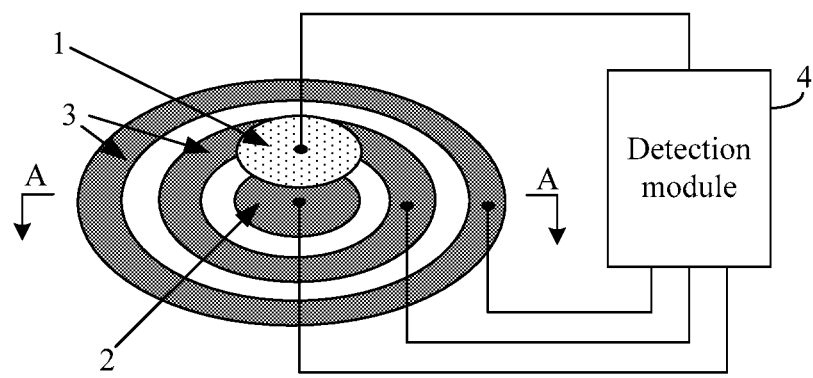
FIG. 1 is a structural schematic diagram of a pressure detection unit provided by a first embodiment of the present disclosure.
Figure 2A:
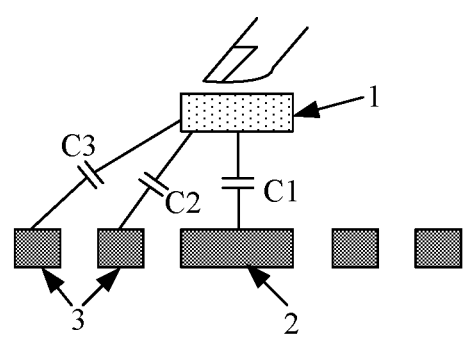
FIG. 2(*a*) and FIG. 2(*b*) are cross-sectional views along direction A-A illustrated in FIG. 1.

FIG. 1 is a structural schematic diagram of a pressure detection unit provided by the first embodiment of the present disclosure; FIG. 2(a) and FIG. (b) are cross-sectional views along direction A-A illustrated in FIG. 1.

Figure 2B:
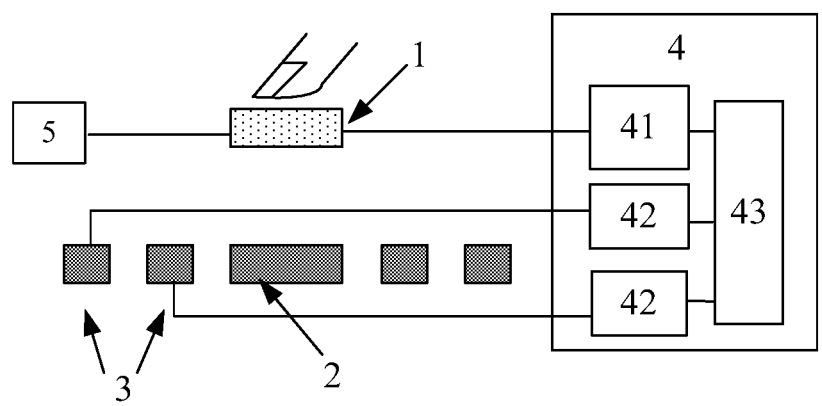

As illustrated in FIG. 1, FIG. 2(a) and FIG. 2(b), the pressure detection unit comprises: a touch control pressure scanning electrode 1, a constant voltage electrode 2, a detection module 4, and at least one touch control pressure induction electrode 3. The pressure detection unit may comprise at least two touch control pressure induction electrodes; in the following, it is described as an example that the pressure detection unit comprises two touch control pressure induction electrodes 3, but the present disclosure is not limited to this example.

The touch control pressure scanning electrode 1 is configured for inputting a touch control pressure scanning signal; the constant voltage electrode 2 is arranged opposite to the touch control pressure scanning electrode 1 and configured for inputting a constant voltage; an orthographic projection of the two touch control pressure induction electrodes 3 in a plane where the touch control pressure scanning electrode 1 locates does not overlap with the touch control pressure scanning electrode 1; the detection module 4 is electrically connected to the touch control pressure scanning electrode 1 and the touch control pressure induction electrodes 3, the detection module 4 is configured for determining a pressure applied on the pressure detection unit according to the change of directly opposite capacitance C1 generated between the touch control pressure scanning electrode 1 and the constant voltage electrode 2 and the change of coupling capacitance C2 and C3 generated between the touch control pressure scanning electrode 1 and the touch control pressure induction electrodes 3 upon touch control operation occurring. The touch control pressure scanning electrode 1 and the constant voltage electrode 2 constitute a capacitor via the insulation layer interposed therebetween and function as the two electrodes of the capacitor; the touch control pressure scanning electrode 1 and each of the touch control pressure induction electrodes constitute a capacitor via the insulation layer interposed therebetween and function as the two electrodes of the capacitor as well.

In the pressure detection unit illustrated in FIG. 1, the touch control pressure scanning electrode 1 and the constant voltage electrode 2 are separated with each other by, for example, an insulation layer (for example, an air layer), and directly opposite capacitance C1 (or capacitor C1) is formed; the touch control pressure scanning electrode 1 and touch control pressure induction electrodes 3 are separated by, for example, an insulation layer, and coupling capacitance C2 and C3 (or capacitors C2 and C3) are formed through fringing field effect. The entire first base substrate (corresponding to a touch control side of the pressure detection unit) is pressed and minor deformation occurs when a user apply pressure to the first base substrate. The distance between the touch control pressure scanning electrode 1 and the constant voltage electrode 2, and the distances between the touch control pressure scanning electrode 1 and each of the touch control pressure induction electrodes 3 are accordingly changed, and therefore, the directly opposite capacitance C1 generated between the touch control pressure scanning electrode 1 and the constant voltage electrode 2, and the coupling capacitance C2 and C3 generated between the touch control pressure scanning electrode 1 and the each of the touch control pressure induction electrodes 3 are also changed; accordingly, the corresponding deformation amount or degree of the first base substrate in the touch control operation can be determined through detecting the change of the directly opposite capacitance C1 and the coupling capacitance C2, C3; because there is correspondence between the deformation of the first base substrate and the pressure applied on the first base substrate, the pressure applied on the first base substrate can be determined, and the pressure detection/sensing can be realized.

It should be understood that the detection module 4 in the present embodiment may have the following methods to determine the pressure applied on the pressure detection unit, but the embodiment is not limited thereto.

First Example

Corresponding pressure values can be obtained according to the data of the change of the capacitance (directly opposite capacitance C1) generated between the touch control pressure scanning electrode 1 and the constant voltage electrode 2, and the data of the change of the capacitance (coupling capacitances C2, C3) generated between the touch control pressure scanning electrode 1 and each of the touch control pressure induction electrodes 3, and then take the average value of the pressure values as the detection result.

Second Example

The data of the change of the capacitance (directly opposite capacitance C1) generated between the touch control pressure scanning electrode 1 and the constant voltage electrode 2, and the data of the change of the capacitance (coupling capacitance C2, C3) generated between the touch control pressure scanning electrode 1 and each of the touch control pressure induction electrodes 3 are taken as a data vector, and inquiry about a pressure value corresponding to the data vector is conducted in a pre-generated lookup table to obtain the detection result. The lookup table contains a series of pressure values and the corresponding data vector.

In the present embodiment, with the data of the change of the directly opposite capacitance C1 generated between the touch control pressure scanning electrode 1 and the constant voltage electrode 2, and the data of the change of the coupling capacitances C2, C3 generated between the touch control pressure scanning electrode 1 and each of the touch control pressure induction electrodes 3, the pressure applied on the pressure detection unit can be determined based on the above data in combination; therefore, the accuracy of the pressure detection result can be improved.

For example, as illustrated in FIG. 2(b), the detection module 4 comprises a first detection sub-module 41, at least one second detection sub-module 42, and a determination sub-module 43. In the following, it is described as an example that the detection module 4 comprises two second detection sub-modules 42 corresponding to the two touch control pressure induction electrodes 3, but the present disclosure is not limited to this example.

The first detection sub-module 41 is electrically connected to the touch control pressure scanning electrode 1, and the first detection sub-module 41 is configured for detecting a first induction signal loaded on the touch control pressure scanning electrode 1 when a touch control operation occurs; the second detection sub-module(s) 42 is in one-to-one correspondence with the touch control pressure induction electrode(s) 3, the second detection sub-modules 42 are each electrically connected to the corresponding touch control pressure induction electrodes 3, and configured for detecting a second induction signal loaded on the touch control pressure induction electrodes 3 when the touch control operation occurs; the determination sub-module 43 is electrically connected to the first detection sub-module 41 and each of the second detection sub-modules 42, the determination sub-module 43 is configured for determining the pressure applied on the pressure detection unit according to the first induction signal and each of the second induction signals.

In the embodiment of the present disclosure, the detection module 4 (and the first detection sub-module 41, the second detection sub-module(s) 42 and the determination sub-module 43 described above) can be realized through hardware, firmware or software, or through the arbitrary combination of hardware, firmware and software. For example, the detection module 4 can be a detection chip or a detection circuit.

Furthermore, as illustrated in FIG. 2(b), the touch control pressure scanning electrode 1 is electrically connected to a driving circuit (for example, a driving chip) 5, the driving circuit 5 is configured for applying a touch control pressure scanning signal to the touch control pressure scanning electrode 1.

Even though the detection module 4 and the driving circuit 5 are separately arranged, as illustrated in FIG. 2(b), the detection module 4 and the driving circuit 5 can be integrated in one chip in the embodiment of the present disclosure, for example, a pressure touch control detection/driving chip.

In the present embodiment, the data of the change of the directly opposite capacitance C1 generated between the touch control pressure scanning electrode 1 and the constant voltage electrode 2 can be detected through the first detection sub-module 41; the data of the change of the capacitance C2 and C3 generated between the touch control pressure scanning electrode 1 and each of the touch control pressure induction electrodes 3 can be detected through the second detection sub-module 42

Figure 3:
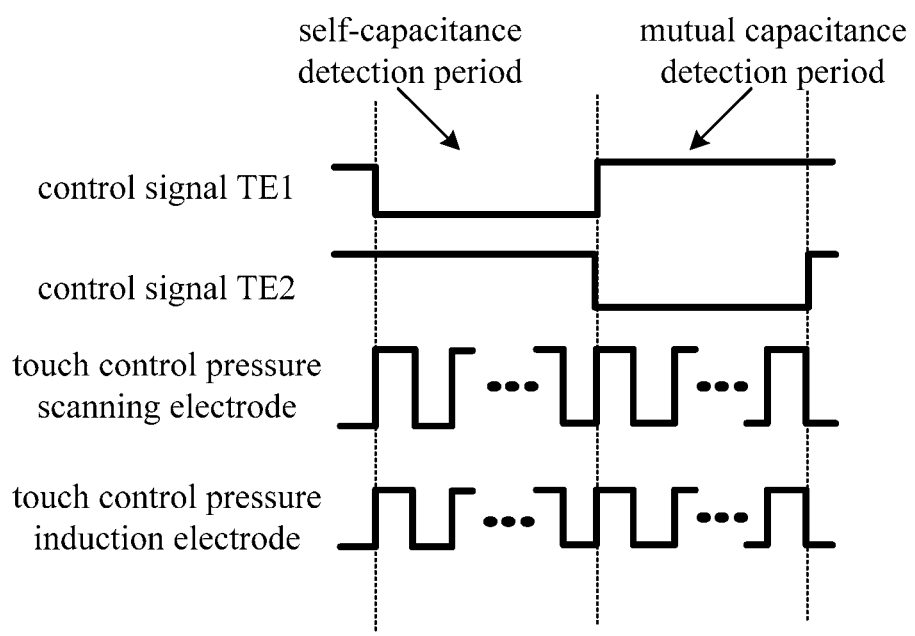
FIG. 3 is a timing chart of the pressure detection unit illustrated in FIG. 1.

In the following, a working process of the pressure detection unit provided by the embodiment is described in detail with reference to the accompany drawings. FIG. 3 is a timing chart of the pressure detection unit illustrated in FIG. 1. As illustrated in FIG. 3, the working process of the pressure detection unit comprises a self-capacitance detection period and a mutual capacitance detection period.

In the present embodiment, self-capacitance type touch control detection is adopted in detecting the change of the directly opposite capacitance C1 generated between the touch control pressure scanning electrode 1 and the constant voltage electrode 2. For example, in the self-capacitance detection period, a touch control pressure scanning signal is input into the touch control pressure scanning electrode 1 with a driving circuit (for example, a driving chip). Because of the impact of the touch control operation of the user (i.e., the directly opposite capacitance C1 generated between the touch control pressure scanning electrode 1 and the constant voltage electrode 2 is changed), RC delay (resistance capacitance delay) problem is occurred for the touch control pressure scanning electrode 1, the wave form of the first induction signal actually loaded on the touch control pressure scanning electrode 1 at this time is different from the preset wave form of a pressure scanning signal (for example, the wave form without pressure applied to the touch control pressure scanning electrode). Therefore, the change, which is caused by the touch control operation, of the directly opposite capacitance C1 generated between the touch control pressure scanning electrode 1 and the constant voltage electrode 2 can be obtained through detecting the first induction signal actually loaded on the touch control pressure scanning electrode 1 with the first detection sub-module.

As seen from the above contents, in the self-capacitance type touch control detection process, the constant voltage electrode 2 only need to be electrically connected with a constant voltage; the constant voltage electrode 2, for example, can be grounded for simplification and avoiding impact to other structures.

In the present embodiment, mutual capacitance type touch control detection is adopted in detecting the change of the coupling capacitance C2 and C3 generated between the touch control pressure scanning electrode 1 and each of the touch control pressure induction electrodes 3. For example, in the mutual capacitance detection period, a touch control pressure scanning signal is inputted into the touch control pressure scanning electrode 1 with a driving circuit, and then a second induction signal can be induced on each of the touch control pressure induction electrodes 3 due to the coupling therebetween, the second induction signal with the touch control operation occurring is different from the second induction signal without the touch control operation occurring. Therefore, the change, which is caused by the touch control operation, of the coupling capacitance C2, C3 generated between the touch control pressure scanning electrode 1 and the corresponding touch control pressure induction electrodes 3 can be obtained through detecting the second induction signals loaded on the touch control pressure induction electrodes 3 with the second detection sub-module.

With the first induction signal detected by the first detection sub-module and the second induction signals detected by the second detection sub-modules, the pressure applied on the pressure detection unit can be accurately determined based on the above data in combination by the determination sub-module.

It should be understood that two control signals TE1 and TE2 can be provided in the detection module 4 and function as identification to distinguish the self-capacitance detection period and the mutual capacitance detection period. For example, the control signal TE1 is a low level signal and the control signal TE2 is a high level signal in the self-capacitance detection period; the control signal TE1 is a high level signal and the control signal TE2 is a low level signal in the mutual capacitance detection period.

Furthermore, the self-capacitance detection period and the mutual capacitance detection period can be carried on at the same time when the following requirement is fulfilled: the sub-module (for example, the first detection sub-module), which is configured for detecting the data of the change of the directly opposite capacitance C1 generated between the touch control pressure scanning electrode 1 and the constant voltage electrode 2, in the detection module 4, and the sub-module (for example, the second detection sub-module) for detecting the data of the change of the coupling capacitance C2 and C3 generated between the touch control pressure scanning electrode 1 and each of the touch control pressure induction electrodes 3 are independent with each other; and then the signal crosstalk problem in the detection process can be avoided.

In the present embodiment, the number of obtained second induction signals is increased as the number of the touch control pressure induction electrodes 3 of the pressure detection unit, and accordingly the base data for determining the pressure applied on the pressure detection unit is increased and the accuracy of the ultimate pressure detection result is accordingly improved. In the case of the number of the touch control pressure induction electrodes 3 is larger than one (1), the touch control pressure induction electrodes 3 are insulated with each other, and the orthographic projections of the touch control pressure induction electrodes 3 in the plane where the touch control pressure scanning electrode 1 locates are arranged in a sequentially encircled manner, so as to avoid interference between each of the touch control pressure induction electrodes 3.

However, in practical applications, the number of the second detection sub-modules is increased with the number of the touch control pressure induction electrodes 3, therefore, the production cost and the computational complexity for detection are accordingly increased. In consideration of the detection accuracy, the production cost and the computational complexity, the number of the touch control pressure induction electrode 3 is, for example, two in the present embodiment.

Descriptions of the exemplary structures, which are suitable for the touch control pressure scanning electrode 1, touch control pressure induction electrode 3 and constant voltage electrode 2 in the present disclosure, is given in the following content.

As illustrated in FIG. 1, the constant voltage electrode 2 is a plate-shaped electrode, and the touch control pressure induction electrodes 3 is a ring-shaped electrode, the orthographic projection of the touch control pressure induction electrodes 3 in the plane where the touch control pressure scanning electrode 1 locates encircles a orthographic projection of the constant voltage electrode 2 in the plane where the touch control pressure scanning electrode 1 locates. The ring-shaped electrodes, which functions as the touch control pressure induction electrodes 3, can be closed or unclosed.

For example, the constant voltage electrode 2 is a circular plate-shaped electrode and the touch control pressure induction electrodes 3 are circular ring-shaped electrodes; the orthographic projection of the constant voltage electrode 2 in the plane where the touch control pressure scanning electrode 1 locates is concentric with the orthographic projection of the touch control pressure induction electrodes 3 in the plane where the touch control pressure scanning electrode 1 locates.

In the present embodiment, for example, the constant voltage electrode 2 and the touch control pressure induction electrodes 3 are arranged in the same plane, and the constant voltage electrode 2 and the touch control pressure induction electrodes 3 can be formed on the substrate at the same time through a single patterning process, and therefore, the production cycle can be shortened. For example, the constant voltage electrode 2 and the touch control pressure induction electrodes 3 can be arranged in different planes, for example, the touch control pressure induction electrodes 3 are closer to touch control pressure scanning electrode 1 with respect to the base substrate.

Figure 4:
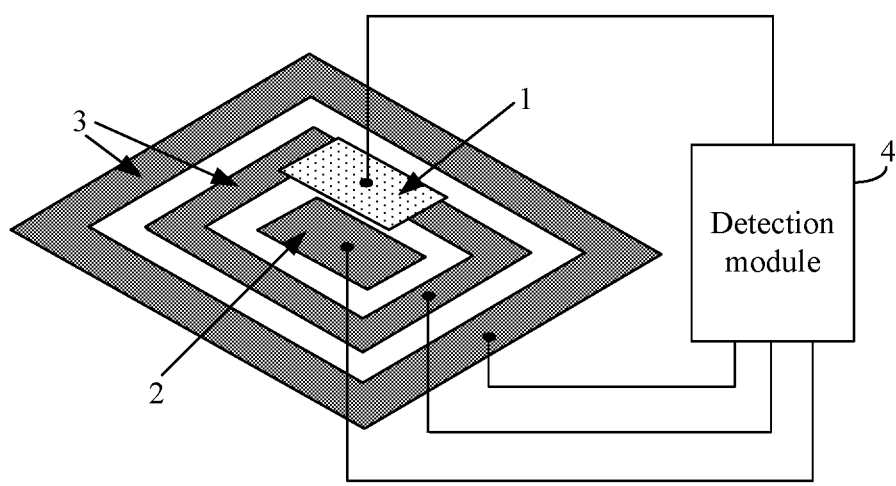
FIG. 4 is a structural schematic diagram of another pressure detection unit provided by the first embodiment of the present disclosure.

FIG. 4 is a structural schematic diagram of another pressure detection unit provided by the embodiment of the present disclosure.

The difference between the pressure detection unit illustrated in FIG. 4 and the pressure detection unit illustrated in FIG. 1 are the following: in FIG. 4, the constant voltage electrode 2 is a rectangular plate-shaped electrode and the touch control pressure induction electrodes 3 are rectangular ring-shaped electrodes, an outside edge of the constant voltage electrode 2 is parallel with an inside edge of the touch control pressure induction electrodes 3.

It should be understood that the specific structures of the constant voltage electrode 2, touch control pressure scanning electrode 1 and touch control pressure induction electrodes 3 illustrated in FIG. 1 and FIG. 4 are only exemplary structures, and should not recognized as limitations upon the technical solutions. The constant voltage electrode 2, touch control pressure scanning electrode 1 and the touch control pressure induction electrodes 3 in the embodiments of the present disclosure can also adopt other structures; no further examples will be given herein.

Second Embodiment

Figure 5:
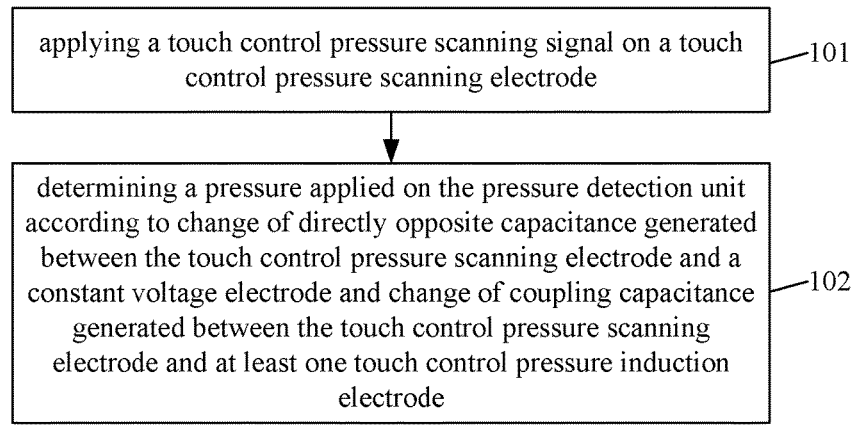
FIG. 5 is a flow chart of a pressure detection method provided by a second embodiment of the present disclosure.

FIG. 5 is a flow chart of a pressure detection method provided by the second embodiment of the present disclosure. As illustrated in FIG. 5, the pressure detection method is based on the pressure detection unit provided by the embodiment of the present disclosure, for example, the content related to the pressure detection unit can refer to the first embodiment. The pressure detection method can comprise the following step 101 and step 102.

Step 101: applying a touch control pressure scanning signal on a touch control pressure scanning electrode.

In step 101, the touch control pressure scanning signal is applied on the touch control pressure scanning electrode with a driving chip, directly opposite capacitance is generated between the touch control pressure scanning electrode and the constant voltage electrode, and coupling capacitance is generated between the touch control pressure scanning electrode and the touch control pressure induction electrode(s).

Step 102: determining a pressure applied on the pressure detection unit according to the change of the directly opposite capacitance between the touch control pressure scanning electrode and the constant voltage electrode and the change of the coupling capacitance between the touch control pressure scanning electrode and the touch control pressure induction electrode(s).

Step 102 is conducted by the detection module provided by the first embodiment; the process can refer to the description of the above first embodiment.

For example, an example of step 102 can comprise the following step 1021 to step 1023.

Step 1021: detecting a first induction signal actually loaded on the touch control pressure scanning electrode;

Step 1022: detecting a second induction signal loaded on each of the touch control pressure induction electrodes; and Step 1023: determining the pressure applied on the pressure detection unit according to the first induction signal and each of the second induction signals.

Step 1021 is conducted by the first detection sub-module provided by the above first embodiment; step 1022 is conducted by the second detection sub-modules provided by the above first embodiment; step 1023 is conducted by the determination detection sub-module provided by the above first embodiment; the process can refer to the relevant description in the above first embodiment, no further description will be given herein.

Third Embodiment

The third embodiment of the present disclosure provide a display panel, which comprises a pressure detection unit, which employs the pressure detection unit provided by the above first embodiment, the exemplary structure of the pressure detection unit can refer to the corresponding description in the above first embodiment, no further description will be given herein.

Figure 6:
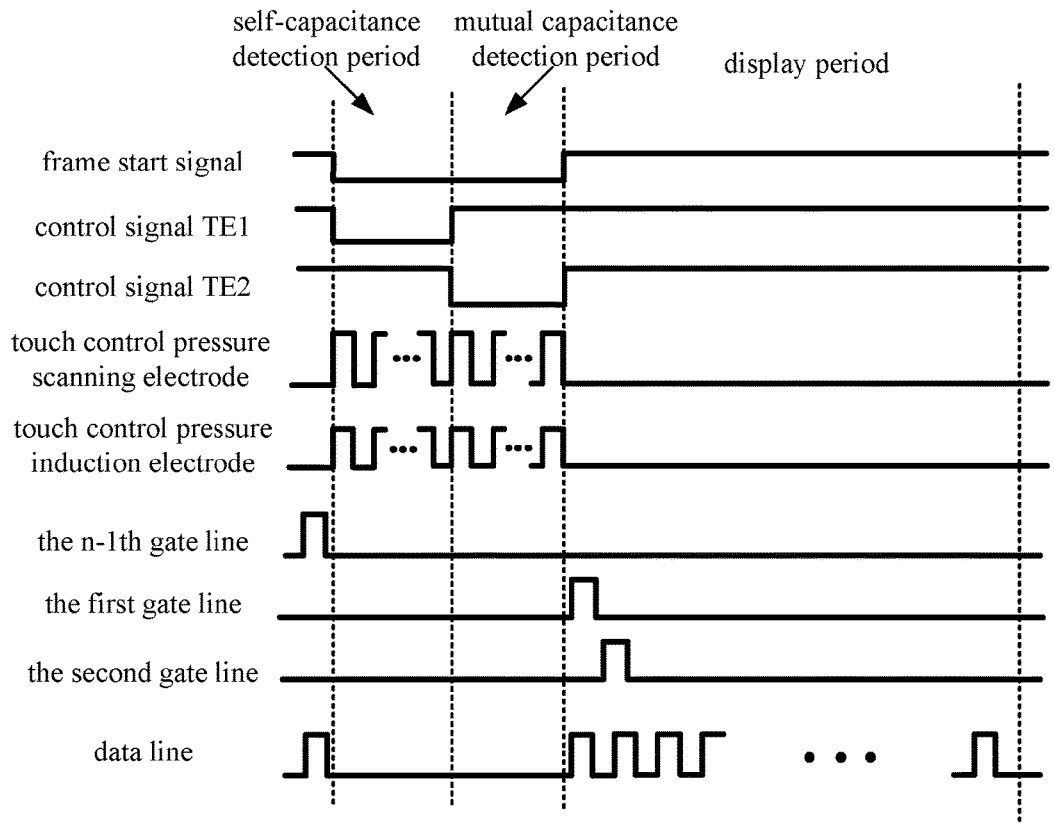
FIG. 6 is a timing chart of a display panel provided by a third embodiment of the present disclosure.

FIG. 6 is a timing chart of a display panel provided by the third embodiment of the present disclosure. As illustrated in FIG. 6, the working process of the display panel comprises a self-capacitance detection period, a mutual capacitance detection period and a display period.

The working process for the self-capacitance detection period and the mutual capacitance detection period can refer to the description of the first embodiment, in the following, only the driving process of the display period is described.

In the display period, a frame start signal is switched from a low level signal to a high level signal, both of the control signal TE1 and TE2 are high level signals, gate scanning signals are inputted into each of the gate lines of the display panel, data signals are inputted in the data lines, so as to generate corresponding grayscale for pixel units, and the display panel can display an image.

As a practical application solution, the refresh rate of the display panel is 60 HZ for example; in one period, both of the time intervals for the self-capacitance detection period and the mutual capacitance detection period are 2 ms, and the time interval for the display period is 12.67 ms.

In the present embodiment, the pressure detection unit can be integrated with the display panel through an on-cell method or an in-cell method. For example, the pressure detection unit can be arranged in the display panel through an in-cell method. For example, the touch control pressure scanning electrode can be formed inside of the array substrate, the constant voltage electrode and the touch control pressure induction electrode can be formed inside of the cell assembly substrate; or, the touch control pressure scanning electrode can be formed inside of the cell assembly substrate, the constant voltage electrode and the touch control pressure induction electrode can be formed inside of the array substrate. Because of the touch control pressure scanning electrode, the constant voltage electrode and the touch control pressure induction electrode, which are configured for the pressure detection, are formed inside of the display panel (i.e., in-cell type), it's not necessary to change the overall structure of the display device; therefore, the detection result is not affected by the assembly tolerance of the pressure detection unit, and the accuracy of the detection result is high.

It should be understood that the pressure detection unit can arranged in a display region and a non-display region of the display panel. In the case of the pressure detection unit being arranged in the display region of the display panel, the touch control pressure scanning electrode, the constant voltage electrode and the touch control pressure scanning electrode should be formed of a transparent conductive material.

Furthermore, in the case of the pressure detection unit being arranged in the display region of the display panel, an inference signal (noise signal) may be generated on the touch control pressure scanning electrode and touch control pressure induction electrode because of the impact or influence of the signals over the gate lines and data lines in the display period. Interference to the useful signals, which is loaded on the touch control pressure scanning electrode and touch control pressure induction electrode in the self-capacitance detection period and the mutual capacitance detection period, can be caused by the induction signal; and then impact to the ultimate detection result can be caused. To solve the above technical problem, a constant voltage is inputted into the touch control pressure scanning electrode and touch control pressure induction electrode in the display period of the present embodiment, so as to initialize the touch control pressure scanning electrode and touch control pressure induction electrode before entering the self-capacitance detection period or the mutual capacitance detection period.

It should be understood that the display panel in the present embodiment can be a liquid crystal display panel and an active matrix organic light-emitting diode (AMOLED) display panel, but the embodiment is not limited thereto What are described above is related to the illustrative embodiments of the disclosure only and not limitative to the scope of the disclosure; the scopes of the disclosure are defined by the accompanying claims.

The application claims priority to the Chinese patent application No. 201610121253.3, filed Mar. 3, 2016, the entire disclosure of which is incorporated herein by reference as part of the present application.

What is claimed is:
1. A pressure detection unit, comprising:
  a touch control pressure scanning electrode, which is configured for inputting a touch control pressure scanning signal;
  a constant voltage electrode, which is arranged opposite to the touch control pressure scanning electrode, wherein the constant voltage electrode is configured for inputting a constant voltage;
  at least one touch control pressure induction electrode, wherein an orthographic projection of the at least one touch control pressure induction electrode in a plane where the touch control pressure scanning electrode locates does not overlap with the touch control pressure scanning electrode; and
  a detection module, which is electrically connected to the touch control pressure scanning electrode and the at least one touch control pressure induction electrode, wherein the detection module is configured for determining a pressure applied on the pressure detection unit according to change of directly opposite capacitance generated between the touch control pressure scanning electrode and the constant voltage electrode and change of coupling capacitance generated between the touch control pressure scanning electrode and the at least one touch control pressure induction electrode upon a touch control operation occurring.

2. The pressure detection unit according to claim 1, wherein, the constant voltage electrode and the at least one touch control pressure induction electrode are arranged on a same plane.

3. The pressure detection unit according to claim 1, wherein, the constant voltage electrode is a plate-shaped electrode and the at least one touch control pressure induction electrode is a ring-shaped electrode.

4. The pressure detection unit according to claim 3, wherein, the orthographic projection of the at least one touch control pressure induction electrode in the plane where the touch control pressure scanning electrode locates encircles an orthographic projection of the constant voltage electrode in the plane where the touch control pressure scanning electrode locates.

5. The pressure detection unit according to claim 3, wherein, the constant voltage electrode is a circular plate-shaped electrode and the at least one touch control pressure induction electrode is a circular ring-shaped electrode.

6. The pressure detection unit according to claim 5, wherein, the orthographic projection of the constant voltage electrode in the plane where the touch control pressure scanning electrode locates is concentric with the orthographic projection of the at least one touch control pressure induction electrode in the plane where the touch control pressure scanning electrode locates.

7. The pressure detection unit according to claim 3, wherein, the constant voltage electrode is a rectangular plate-shaped electrode and the at least one touch control pressure induction electrode is a rectangular ring-shaped electrode, and an outside edge of the constant voltage electrode is parallel with an inside edge of the at least one touch control pressure induction electrode.

8. The pressure detection unit according to claim 3, wherein, the pressure detection unit comprise at least two touch control pressure induction electrode, the touch control pressure induction electrodes are insulated with each other, and the orthographic projections of the touch control pressure induction electrodes in the plane where the touch control pressure scanning electrode locates are arranged in a sequentially encircled way.

9. The pressure detection unit according to claim 1, wherein, the constant voltage electrode is grounded.

10. The pressure detection unit according to claim 1, wherein, the pressure detection unit comprises two touch control pressure induction electrodes.

11. The pressure detection unit according to claim 1, wherein, the detection module comprises:
a first detection sub-module, which is electrically connected to the touch control pressure scanning electrode, wherein the first detection sub-module is configured for detecting a first induction signal actually loaded on the touch control pressure scanning electrode upon the touch control operation occurring;
at least one second detection sub-module, which is in one-to-one correspondence with the at least one touch control pressure induction electrode, wherein the at least one second detection sub-module is electrically connected to the corresponding at least one touch control pressure induction electrode, and configured for detecting a second induction signal loaded on the at least one touch control pressure induction electrodes upon the touch control operation occurring; and
a determination sub-module, which is electrically connected to the first detection sub-module and the at least one second detection sub-modules, wherein the determination sub-module is configured for determining the pressure applied on the pressure detection unit according to the first induction signal and each of the second induction signals.

12. A pressure detection method, which is based on a pressure detection unit, which employs the pressure detection unit according to claim 1, the pressure detection method comprising:
applying a touch control pressure scanning signal on the touch control pressure scanning electrode; and
determining a pressure applied on the pressure detection unit according to change of directly opposite capacitance generated between the touch control pressure scanning electrode and the constant voltage electrode and change of coupling capacitance generated between the touch control pressure scanning electrode and the at least one touch control pressure induction electrode.

13. The pressure detection method according to claim 12, wherein, determining the pressure applied on the pressure detection unit according to the change of the directly opposite capacitance generated between the touch control pressure scanning electrode and the constant voltage electrode and the change of the coupling capacitance generated between the touch control pressure scanning electrode and the at least one touch control pressure induction electrode comprises:
detecting a first induction signal loaded on the touch control pressure scanning electrode;
detecting a second induction signal loaded on the at least one touch control pressure induction electrode; and
determining the pressure applied on the pressure detection unit according to the first induction signal and the second induction signal.

14. A display panel, comprising a pressure detection unit according to claim 1.

15. The display panel according to claim 14, wherein, the display panel is a liquid crystal display panel or an active matrix organic light emitting diode (AMOLED) display panel.

* * * * *